(12) United States Patent
Kang

(10) Patent No.: US 11,726,141 B2
(45) Date of Patent: Aug. 15, 2023

(54) FLIP-FLOP CIRCUITRY

(71) Applicant: Samsung Electronics Co., Ltd., Suwon-si (KR)

(72) Inventor: Byoung Gon Kang, Seoul (KR)

(73) Assignee: Samsung Electronics Co., Ltd.

(*) Notice: Subject to any disclaimer, the term of this patent is extended or adjusted under 35 U.S.C. 154(b) by 0 days.

(21) Appl. No.: 17/720,242

(22) Filed: Apr. 13, 2022

(65) Prior Publication Data

US 2022/0397607 A1 Dec. 15, 2022

(30) Foreign Application Priority Data

Jun. 14, 2021 (KR) .................. 10-2021-0076691

(51) Int. Cl.
| | |
|---|---|
| *H03K 3/03* | (2006.01) |
| *G01R 31/3185* | (2006.01) |
| *G11C 7/22* | (2006.01) |
| *H03K 19/20* | (2006.01) |
| *G11C 7/10* | (2006.01) |
| *H03K 3/037* | (2006.01) |

(52) U.S. Cl.
CPC ...... *G01R 31/318541* (2013.01); *G11C 7/106* (2013.01); *G11C 7/1087* (2013.01); *G11C 7/222* (2013.01); *H03K 3/0372* (2013.01); *H03K 19/20* (2013.01)

(58) Field of Classification Search
CPC ........................................... H03K 3/037

USPC ......................... 327/202, 203, 218
See application file for complete search history.

(56) References Cited

U.S. PATENT DOCUMENTS

| | | | |
|---|---|---|---|
| 7,915,925 B2 | 3/2011 | Cong | |
| 9,035,686 B1 | 5/2015 | Hsu et al. | |
| 9,306,545 B2 | 4/2016 | Baratam | |
| 9,698,762 B2 | 7/2017 | Korolev et al. | |
| 2008/0218233 A1 | 9/2008 | Yamamoto et al. | |
| 2017/0063349 A1* | 3/2017 | Kim | H03K 3/037 |
| 2021/0152162 A1* | 5/2021 | Azmat | G01R 31/3177 |
| 2021/0328582 A1* | 10/2021 | Kang | H03K 3/0372 |

FOREIGN PATENT DOCUMENTS

KR 101928271 B1 12/2018

* cited by examiner

*Primary Examiner* — Anh-Quan Tra
(74) *Attorney, Agent, or Firm* — Myers Bigel, P.A.

(57) ABSTRACT

A flip-flop circuit includes a clock generator configured to generate first and second clock signals having different phases relative to each other, and a master-slave latch circuit including master and slave latches. The master latch includes a scan path configured to output a scan path signal in response to a scan enable signal and a scan input signal, and a data path configured to output a first latch signal in response to a data signal and the scan path signal. A feedback path is provided, which includes a tri-state inverter responsive to the first and second clock signals. The tri-state inverter has an input terminal connected to an output terminal of the data path and an output terminal connected to a node of the scan path.

20 Claims, 10 Drawing Sheets

| M3 | SE | CK | M3CK | Activity |
|---|---|---|---|---|
| 0 | 0 | 0 | 1 | D on |
| 0 | 0 | 1 | 1 | M3' |
| 0 | 1 | 0 | 0 | D off |
| 0 | 1 | 1 | 0 | D off |
| 1 | 0 | 0 | 1 | D on |
| 1 | 0 | 1 | 0 | M3' |
| 1 | 1 | 0 | 0 | D off |
| 1 | 1 | 1 | 0 | D off |

FLIP-FLOP CIRCUITRY

REFERENCE TO PRIORITY APPLICATION

This application claims priority under 35 U.S.C. § 119 to Korean Patent Application No. 10-2021-0076691, filed Jun. 14, 2021, the disclosure of which is hereby incorporated herein by reference.

BACKGROUND

The present disclosure relates to latch circuits, and flip-flop circuits including the same.

Flip-flops are general-purpose data storage elements used in digital electronic circuits, and are important elements in the design of digital circuits. This is because flip-flops are synchronous (e.g., clocked) storage elements, which enable sequential and stable logic design. Flip-flops are typically used to store logic states or parameters or digital control signals.

For example, microprocessors typically include numerous flip-flops. And, in order to meet operation requirements of high-performance microprocessors, the flip-flops are required to provide maximum logic clocking speeds by, among other things, reducing flip-flop setup and hold times and clock-to-output times. Furthermore, the flip-flops are also typically required to reduce unnecessary power consumption when the flip-flops are inactive (i.e., not switching).

SUMMARY

Aspects of the present disclosure provide latch and flip-flop circuits that operate at high speeds, and semiconductor devices that utilize said latch and flip-flop circuits.

Additional aspects of the present disclosure also provide latch and flip-flop circuits that improve data signal input speeds, while maintaining a stable scan input signal path, and semiconductor devices that utilize same.

One embodiment of the present disclosure includes flip-flop circuitry having a master latch, a slave latch and a clock generator therein. The master latch includes: (i) a scan path, which receives a scan enable signal and a scan input signal, and outputs a scan path signal, (ii) a data path that performs an operation on a data signal and the scan path signal, based on output signals of the clock generator, and outputs a first latch signal, and (iii) a feedback path containing a first tri-state inverter, which is connected between an output terminal of the data path and an output terminal of the scan path, and feeds back the first latch signal of the previous state according to the output signals of the clock generator. In some of these embodiments, the data signal may be input to the data path independently of the scan path.

According to another embodiment of the present disclosure, a flip-flop circuit is provided, which includes a clock generator, which generates an inverted clock signal (inverted from an input clock signal) and a buffered clock signal (inverted from the inverted clock signal), and master and slave latches. The master latch includes: (i) a scan path, which performs an operation on an inverted scan enable signal and an inverted scan input signal and outputs a scan path signal according to an output signal of the clock generator, and (ii) a data path, which outputs a signal obtained by performing an operation on the inverted scan enable signal, the output signal of the clock generator, and a data signal, as a first latch signal according to the scan path signal. In this embodiment, the data signal is input to the data path independently of the scan path.

Other embodiments of the present disclosure include a flip-flop circuit having a clock generator, a master latch having a scan path and a data path independent of each other, and a slave latch coupled to an output of the master latch. The scan path performs an operation on an inverted scan enable signal and an inverted scan input signal, and outputs a scan path signal according to an output signal of the clock generator. And, the data path includes: (i) a NAND circuit, which performs an operation on a clock signal and a first latch signal, and outputs a modified clock signal, and (ii) an AOI circuit that receives the inverted scan enable signal, the modified clock signal, and a data signal, and performs an AND operation on the inverted scan enable signal, the modified clock signal, and the data signal, and performs a NOR operation on the scan path signal and a signal obtained by the AND operation, and outputs a signal obtained by the NOR operation as a first latch signal of the next stage.

According to further embodiments of the present disclosure, a flip-flop circuit is provided, which includes a clock generator configured to generate first and second clock signals having different phases relative to each other, and a master-slave latch circuit including a master latch and a slave latch coupled thereto. The master latch may include: (i) scan path circuitry, which is configured to output a scan path signal in response to a scan enable signal and a scan input signal, (ii) data path circuitry, which is configured to output a first latch signal in response to a data signal and the scan path signal, and (iii) feedback path circuitry including a first tri-state inverter, which is responsive to the first and second clock signals, and has an input terminal connected to an output terminal of the data path and an output terminal connected to a node of the scan path. In some of these embodiments, the scan path may include a second tri-state inverter, which is responsive to the plurality of clock signals, and a node of the scan path may correspond to an output terminal of the second tri-state inverter. In other embodiments, the scan path may include a logic gate having first and second input terminals responsive to the scan enable signal and the scan input signal, respectively, and a second tri-state inverter having an input terminal electrically coupled to an output terminal of the logic gate and an output terminal electrically connected to the node of the scan path. These true and complementary control terminals of the second tri-state inverter may be responsive to the first and second clock signals, respectively, and the true and complementary control terminals of the first tri-state inverter may be responsive to the second and first clock signals, respectively.

However, aspects of the present disclosure are not restricted to those set forth herein. The above and other aspects of the present disclosure will become more apparent to one of ordinary skill in the art to which the present disclosure pertains by referencing the detailed description of the present disclosure given below.

BRIEF DESCRIPTION OF THE DRAWINGS

The above and other aspects and features of the present disclosure will become more apparent by describing in detail exemplary embodiments thereof with reference to the attached drawings, in which.

DETAILED DESCRIPTION OF THE EMBODIMENTS

Terms "first", "second" and the like are used to describe various elements or components, but these elements or components are not limited by these terms. These terms are used only in order to distinguish one element or component from another element or component. Therefore, a first element or component mentioned below may be a second element or component within the technical spirit of the present disclosure.

In the present specification, a common node refers to a point at which any one terminals of at least two transistors are connected to each other. For example, a common node between a first transistor and a second transistor may refer to a point at which a source terminal or drain terminal of the first transistor and a drain or source terminal of the second transistor are connected to each other.

In the present specification, the meaning that a transistor is shared is that at least two logic circuits operate while including the same transistor, respectively. For example, when there is a first transistor shared by a first logic circuit and a second logic circuit, it may mean that the first transistor operates while being included in the first logic circuit and simultaneously or sequentially operates while being included in the second logic circuit. Hereinafter, flip-flop circuitries according to some exemplary embodiments of the present disclosure will be described with reference to FIGS. 1 to 19.

Figure 1:
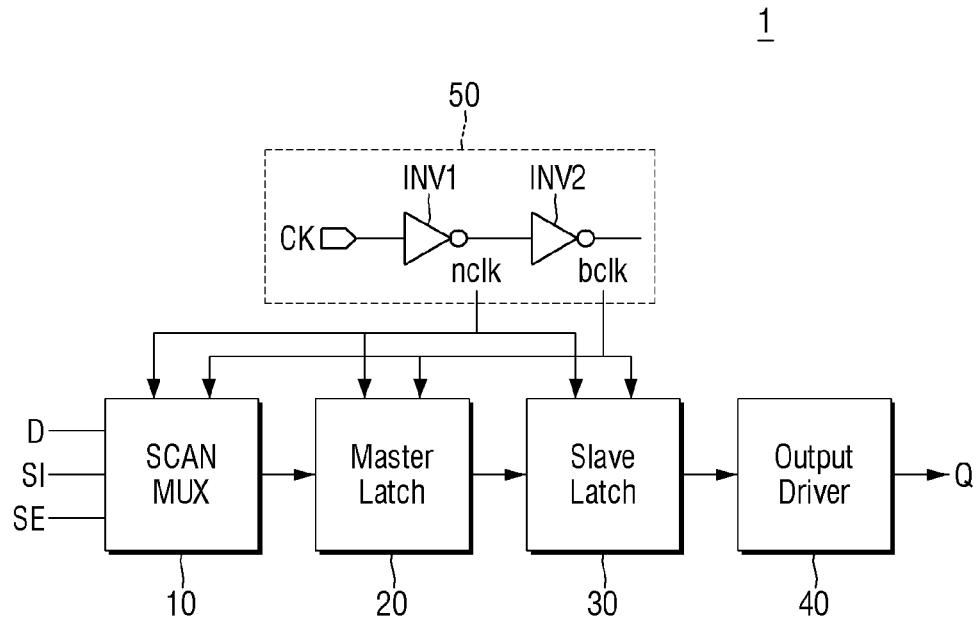
FIG. 1 is a block diagram illustrating a flip-flop circuit according to embodiments of the invention.

FIG. 1 is a block diagram illustrating a flip-flop circuitry. Referring to FIG. 1, a semiconductor device 1 according to some exemplary embodiments may include a scan mux circuit (or a scan multiplexer) 10, master and slave latch circuits 20 and 30, respectively, a clock buffer circuit 50 including inverters INV1 and INV2, and an output driver circuit 40. The scan mux circuit 10 receives data D and/or a scan input signal SI for a scan operation on a semiconductor circuit (not illustrated) and outputs any one of the data D and the scan input signal SI, according to a clock signal CK. To this end, when a scan enable signal SE is at a logic high level and an inverted scan enable signal SEN is at a logic low level, the scan mux circuit 10 inverts the scan input signal SI and outputs the inverted scan input signal to the master latch circuit 20. On the other hand, when the scan enable signal SE is at a logic low (L) level and an inverted scan enable signal SEN is at a logic high (H) level, the scan mux circuit 10 inverts the data D and outputs the inverted data to the master latch circuit 20. Thus, the scan mux circuit 10 is configured to output the scan input signal SI to the latch circuits 20 and 30 when the scan enable signal SE is activated, and output the data signal D to the latch circuits 20 and 30 when the scan enable signal SE is deactivated.

Meanwhile, the inverters INV1 and INV2 within the clock buffer circuit 50 receive a clock signal CK and output an inverted clock signal nclk and a re-inverted clock signal bclk, respectively. The inverted clock signal nclk is generated by inverting the clock signal CK using INV1, and the re-inverted clock signal bclk is generated by re-inverting the inverted clock signal nclk using INV2. Both of the inverted clock signal nclk and the re-inverted clock signal bclk are provided to the master and slave latch circuits 20 and 30. The re-inverted clock signal bclk has the same phase as the clock signal CK (but is delayed), and will thus be hereinafter referred to as a buffered clock signal bclk for convenience of explanation.

The first "master" latch circuit 20 latches an output signal of the scan mux circuit 10 based on the buffered clock signal bclk and the inverted clock signal nclk and transfers the output signal to the second "slave" latch circuit 30. The second latch circuit 30 latches the output signal of the first latch circuit 20 based on the buffered clock signal bclk and the inverted clock signal nclk and transfers the output signal to the output driver circuit 40.

In particular, the first latch circuit 20 may serve as a master latch latching the output signal of the scan mux circuit 10 at a rising edge of the buffered clock signal bclk and transferring the output signal to the second latch circuit 30, and the second latch circuit 30 may serve as a slave latch latching the output signal of the first latch circuit 20 and transferring the output signal to the output driver circuit 40. The output driver circuit 40 receives the output signal of the second latch circuit 30 and outputs the output signal as data Q to another circuit or device.

Figure 2:
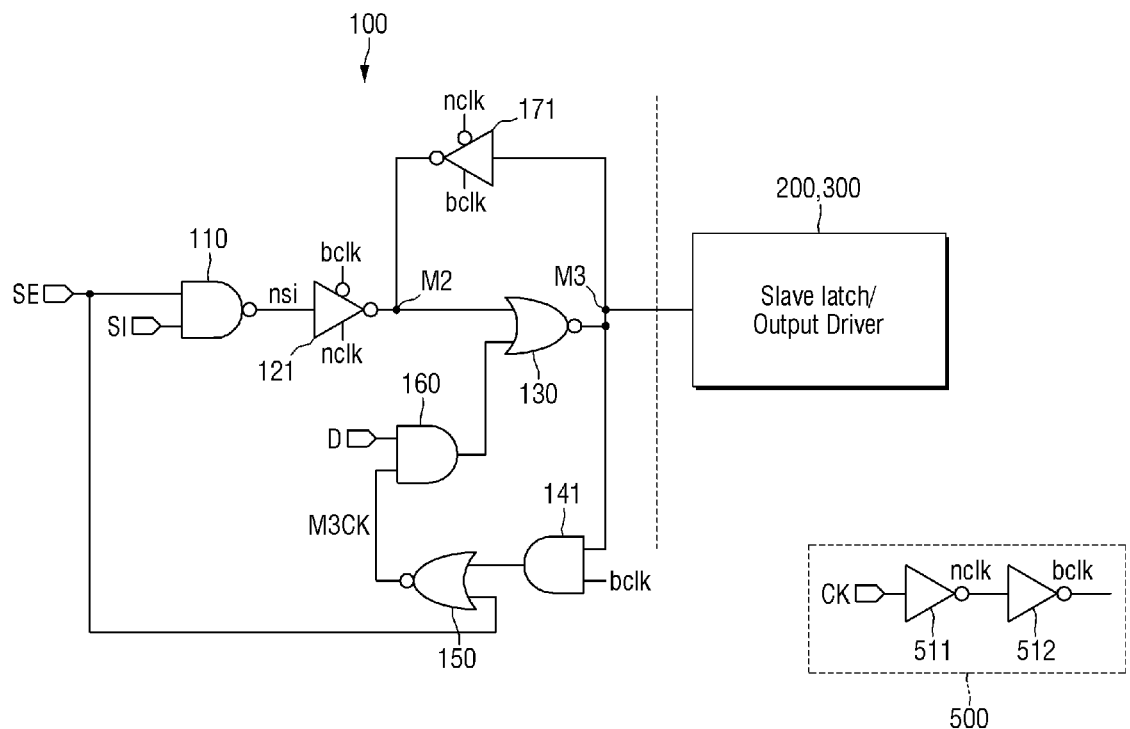
FIG. 2 is a circuit diagram illustrating the flip-flop circuit according to some exemplary embodiments.

FIG. 2 is a circuit diagram illustrating the flip-flop circuit according to some exemplary embodiments. Referring to FIG. 2, the flip-flop circuit includes a merged scan mux and master latch 100, a slave latch 200, an output driver 300, and a clock generator 500. The clock generator 500 of FIG. 2 may include a plurality of inverter circuits 511 and 512, receive an input clock signal CK, generate an inverted clock signal nclk inverted from the input clock signal CK, and generate a buffered clock signal bclk re-inverted from the inverted clock signal nclk. The scan mux circuit 10 and the master latch circuit 20 of FIG. 1 may be implemented as the merged master latch 100 of FIG. 2, and the merged master latch 100 includes a scan path, a data path, and a feedback path.

As illustrated by FIG. 2, the scan path receives a scan enable signal SE and a scan input signal SI and outputs a scan path signal M2. According to some exemplary embodiments, the scan path may include a NAND circuit 110 and a tri-state inverter circuit 121. The NAND circuit 110 may perform a NAND operation on the scan enable signal SE and the scan input signal SI and output a basic scan signal nsi. The tri-state inverter circuit 121 may invert and output the basic scan signal nsi as the scan path signal M2 according to output signals (e.g., the inverted clock signal nclk and the buffered clock signal bclk) of the clock generator 500.

The data path may perform an operation on a data signal D and the scan path signal M2 based on the output signals (e.g., the inverted clock signal nclk and the buffered clocked signal bclk) of the clock generator 500 and output a first latch signal M3. According to some exemplary embodiments, the data path may include two AND-OR-Inverter (AOI) circuits (e.g., AND-NOR). An AOI circuit 141 and 150 receives the output signal (e.g., the buffered clock signal bclk) of the clock generator 500 and the first latch signal M3, performs an AND operation 141 on the output signal of the clock generator 500 and the first latch signal M3, and performs a NOR operation 150 on a signal obtained by such an AND operation 141 and the scan enable signal SE to generate an modified clock signal M3CK. In this case, the first latch signal M3 input to the AOI circuit 141 and 150 is the first latch signal M3 in the previous stage in which an operation has been completed rather than a current stage in which an operation is being performed.

An AOI circuit 160 and 130 performs an AND operation 160 on the data signal D and the modified clock signal M3CK, performs a NOR operation 130 on a signal obtained by such an AND operation 160 and the scan path signal M2, and outputs a signal generated by such a NOR operation 130 as the first latch signal M3 of the current stage. The feedback path may feed back the first latch signal M3 of the previous stage to the master latch according to the output signals of the clock generator 500 to hold the first latch signal M3 generated in the previous stage. According to some exemplary embodiments, the feedback path includes a tri-state inverter 171. The tri-state inverter 171 is connected between an output terminal M3 of the data path and an output terminal M2 of the scan path, and feeds back the first latch signal M3 of the previous stage to the output terminal of the scan path according to the output signals of the clock generator. When the slave latch 200 receives the first latch signal M3, the slave latch 200 performs a slave latch operation according to the output signals of the clock generator 500, and outputs a second latch signal QI to the output driver 300. The slave latch 200 may be variously implemented according to various exemplary embodiments. The output driver circuit 300 may drive and output the second latch signal QI (Q or QN).

Figure 3:
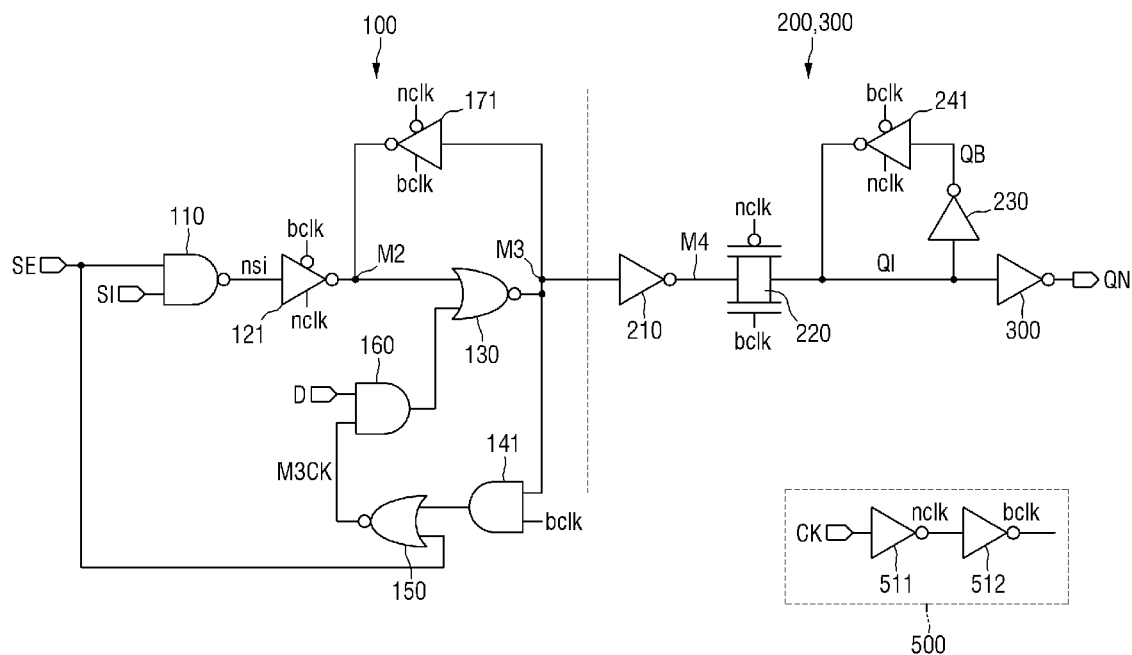
FIG. 3 is a circuit diagram illustrating the flip-flop circuit according to some exemplary embodiments.

FIG. 3 is a circuit diagram illustrating the flip-flop circuit according to some exemplary embodiments. For convenience of explanation, a difference from FIG. 2 will be mainly described. Referring to FIG. 3, the master latch 100 may include the scan path, the data path, and the feedback path according to some exemplary embodiments, as described with reference to FIG. 2. The scan path receives the scan enable signal SE and the scan input signal SI, the data path receives the data signal D and the output signals of the clock generator 500, and the feedback path receives and feeds back a master latch signal (e.g., also referred to as the first latch signal) of the previous stage. The data path may perform an operation on a scan path signal or a feedback path signal with the data signal D based on the output signals of the clock generator 500 and output a signal obtained by such an operation as a master latch signal of the current stage. The implementation of the master latch 100 may be the same as that described with reference to FIG. 2.

According to some exemplary embodiments, the slave latch may include an inverter 210, a transfer transistor 220, an inverter 230, and a tri-state inverter 241. The inverter 210 may invert the first latch signal M3 and output the inverted first latch signal M4. The transfer transistor 220 may output the inverted first latch signal M4 as the second latch signal QI according to the output signals bclk and nclk of the clock generator 500. The inverter 230 may invert the second latch signal QI and output the inverted second latch signal QB, and the tri-state inverter 241 may feed back the inverted second latch signal QB to an output terminal of the transfer transistor 220 according to the output signals bclk and nclk of the clock generator 500.

The slave latch may hold the second latch signal QI of the previous stage as the inverted second latch signal QB using the inverter 230 and the tri-state inverter 241 as a slave feedback path, and then reflect the second latch signal QI of the previous stage in a second latch signal of the current stage according to the output signals bclk and nclk of the clock generator 500. Advantageously, because the slave latch 200 uses the inverter 230 and the transfer transistor, an operation delay (e.g., CK-Q delay) according to a clock signal may be reduced.

Figure 4:
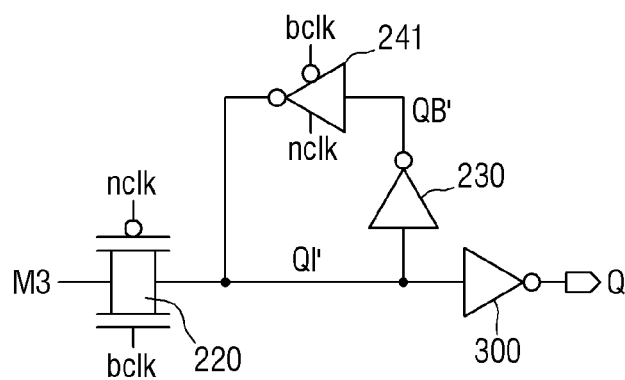
FIG. 4 illustrates an embodiment of a slave latch circuit of FIG. 2, according to some exemplary embodiments.

FIG. 4 illustrates an embodiment of the slave latch circuit of FIG. 2. Referring to FIG. 4, the slave latch may include a transfer transistor 220, an inverter 230, and a tri-state inverter 241, which is dissimilar to the slave latch of FIG. 3. The transfer transistor 220 may output the first latch signal M3 output from the master latch 100 as a second latch signal QI' according to the output "clock" signals bclk and nclk of the clock generator 500. The inverter 230 may invert the second latch signal QI' and output the inverted second latch signal QB', and the tri-state inverter 241 may feed back the inverted second latch signal QB' to an output terminal of the transfer transistor 220 according to the output signals bclk and nclk of the clock generator 500.

The output driver circuit 300 may drive and output the second latch signal QI' (Q). However, in this embodiment, an output signal of the flip-flop circuit 1 is output as Q unlike an exemplary embodiment of FIG. 3. Since the master latch signal M3 is output through the transfer transistor 220 of the slave latch 200 without being inverted, the output signal of the flip-flop circuit 1 may be output as Q in the output driver circuit 300.

Figures 5, 6:
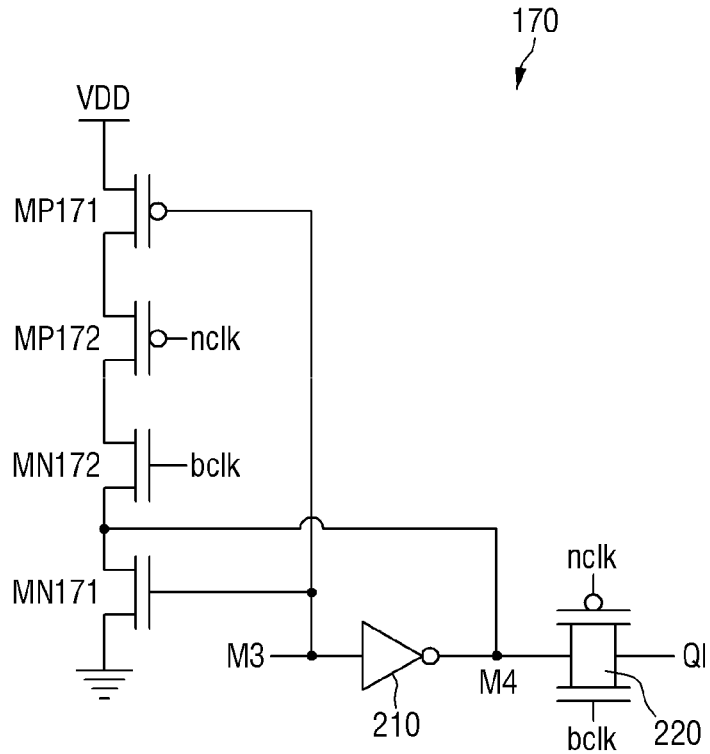
FIG. 5 illustrates a portion of the flip-flop circuit of FIG. 2, according to some exemplary embodiments.
FIG. 6 is a signal table representing operations of the flip-flop circuit of FIG. 3.

FIG. 5 illustrates a portion of the flip-flop circuit of FIG. 2 according to some exemplary embodiments. Referring to FIG. 5, the tri-state inverter 171 of the feedback path may include two P-channel metal oxide semiconductor (PMOS) "pull up" transistors MP171 and MP172 and two N-channel metal oxide semiconductor (NMOS) "pull down" transistors MN172 and MN171 connected in series in a totem-pole arrangement, between a power supply line VDD and a ground line GND according to some exemplary embodiments.

As shown, the PMOS transistor MP171 may have a source terminal which is connected to the power supply line and a gate terminal which is connected to an output terminal of the master latch 100 to be gated according to the master latch signal M3 of the previous stage. The PMOS transistor MP172 may have a source terminal which is connected to a drain terminal of the PMOS transistor MP171 (i.e., a common node between the PMOS transistor MP172 and the PMOS transistor MP171) and a gate terminal to which the inverted clock signal nclk is applied. The NMOS transistor MN171 may have a source terminal which is connected to the ground line and a gate terminal which is connected to the output terminal of the master latch 100 to be gated according to the master latch signal M3 of the previous stage. The NMOS transistor MN172 may have a source terminal which is connected to a drain terminal of the NMOS transistor MN171 (i.e., a common node between the NMOS transistor MN172 and the NMOS transistor MN171) and a gate terminal to which the buffered clock signal bclk is applied. Thus, the PMOS transistor MP172 and the NMOS transistor MN172 may be gated according to the output signals nclk and bclk of the clock generator 500 to feed back the latch signal M3 of the previous stage to an input of the NOR circuit 130.

FIG. 6 is a signal table representing operations of the flip-flop circuit of FIG. 3. The signal table illustrated in FIG. 6 represents operations according to an exemplary embodiment of FIGS. 3 and 5. In the table illustrated in FIG. 6, it is assumed that M3 represents the master latch signal of the previous stage. When M3 is 0 and the scan enable signal SE is 0, if the input clock signal CK is 0 and the buffered clock signal bclk is also 0 accordingly, a modified clock signal M3CK in the AOI circuit 141 and 150 is 1. In the scan path, the scan path signal M2 is deactivated based on the scan enable signal SE, and when the data signal D is input to the AOI circuit 160 and 130, in the master latch, a first latch signal M3' of the previous stage is held and the data path is turned on if the inverted clock signal nclk is 1 and the buffered clock signal bclk is 0 in the feedback path 171, such that the input data signal is output as the first latch signal (D on). This case is, for example, a case where [M3, SE, CK, M3CK]=(0, 0, 0, 1) in the table.

When M3 is 0 and the scan enable signal SE is 0, if the input clock signal CK is 1 and the buffered clock signal bclk is also 1 accordingly, a modified clock signal M3CK in the AOI circuit 141 and 150 is 1. In the scan path, the scan path signal M2 is deactivated based on the scan enable signal SE, but when the data signal D is input to the AOI circuit 160 and 130, in the master latch, even though the data path is turned on, if the inverted clock signal nclk is 0 and the buffered clock signal bclk is 1 in the feedback path 171, the first latch signal M3' of the previous state is output. This case is, for example, a case where [M3, SE, CK, M3CK]=(0, 0, 1, 1) in the table.

When M3 is 1 and the scan enable signal SE is 0, if the input clock signal CK is 0 and the buffered clock signal bclk is also 0 accordingly, a modified clock signal M3CK in the AOI circuit 141 and 150 is 1. In the scan path, the scan path signal M2 is deactivated based on the scan enable signal SE, and when the data signal D is input to the AOI circuit 160 and 130, in the master latch, the first latch signal M3' of the previous stage is held and the data path is turned on if the inverted clock signal nclk is 1 and the buffered clock signal bclk is 0 in the feedback path 171, such that the input data signal is output as the first latch signal (D on). This case is, for example, a case where [M3, SE, CK, M3CK]=(1, 0, 0, 1) in the table.

When M3 is 1 and the scan enable signal SE is 0, if the input clock signal CK is 1 and the buffered clock signal bclk is also 1 accordingly, a modified clock signal M3CK in the AOI circuit 141 and 150 is 0. In the scan path, the scan path signal M2 is deactivated based on the scan enable signal SE, but when the data signal D is input to the AOI circuit 160 and 130, in the master latch, even though the data path is turned on, if the inverted clock signal nclk is 0 and the buffered clock signal bclk is 1 in the feedback path 171, the first latch signal M3' of the previous state is output. This case is, for example, a case where [M3, SE, CK, M3CK]=(1, 0, 1, 0) in the table.

When the scan enable signal SE is 1, the scan path is activated, such that even though the data input signal D is input, the data path is deactivated (D off), and the scan input signal SI is thus output as the output signal of the master latch. This case is, for example, cases where [M3, SE, CK, M3CK]=(0, 1, 0, 0), (0, 1, 1, 0), (1, 1, 0, 0), (1, 1, 1, 0) in the table.

Through the operations described hereinabove, the flip-flop circuit may perform a data latch operation at higher speeds by separating an input path from the scan enable signal and the scan input signal that are not activated relatively frequently as compared with a data input. In addition, the flip-flop circuit may reduce a setup time by delaying an input of the input clock signal using the AOI circuit in the data path.

Figure 7:
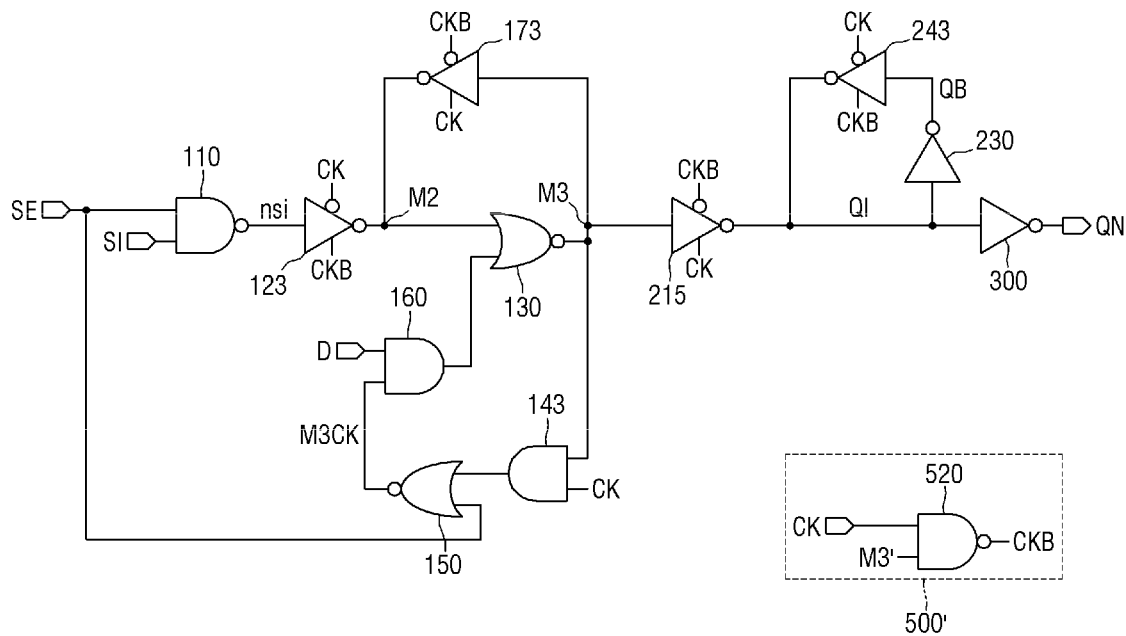
FIG. 7 is a circuit diagram illustrating a flip-flop circuit according to some exemplary embodiments.

FIG. 7 is a circuit diagram illustrating a flip-flop circuit according to some exemplary embodiments. FIGS. 8 to 12 illustrate a portion of the flip-flop circuit of FIG. 7 according to some exemplary embodiments. Referring to FIG. 7, according to various exemplary embodiments, a clock generator 500' may be implemented in a manner different from that of the clock generator of FIG. 2. For example, the clock generator 500' may be implemented as a NAND circuit 520, and may perform a NAND operation on an input clock signal and a modified latch signal M3' to generate a modified inverted clock signal CKB. The implementation of the clock generator 500 will be described in detail with reference to FIGS. 11 and 12.

When comparing an exemplary embodiment of FIG. 7 with an exemplary embodiment of FIG. 2, an exemplary embodiment of FIG. 7 is distinguished from an exemplary embodiment of FIG. 2 in that the input clock signal is connected instead of the buffered clock signal bclk and the modified inverted clock signal CKB is used instead of the inverted clock signal nclk.

According to some exemplary embodiments, the scan path may include a NAND circuit 110 and a tri-state inverter circuit 123. The NAND circuit 110 may perform a NAND operation on the scan enable signal SE and the scan input signal SI and output a basic scan signal nsi. The tri-state inverter circuit 123 may output the basic scan signal nsi as a scan path signal M2 according to the input clock signal Ck and the modified inverted clock signal CKB.

The data path may perform an operation on the data signal D and the scan path signal M2 based on the input clock signal CK and output a first latch signal M3. An AOI circuit 143 and 150 receives the input clock signal CK and the first latch signal M3, performs an AND operation 143 on the input clock signal CK and the first latch signal M3, and performs a NOR operation 150 on a signal obtained by such an AND operation 143 and the scan enable signal SE to generate an modified clock signal M3CK. In this case, the first latch signal M3 input to the AOI circuit 143 and 150 is the first latch signal M3 in the previous stage in which an operation has been completed rather than a current stage in which an operation is being performed.

An AOI circuit 160 and 130 performs an AND operation 160 on the data signal D and the modified clock signal M3CK, performs a NOR operation 130 on a signal obtained by such an AND operation 160 and the scan path signal M2, and outputs a signal generated by such a NOR operation 130 as the first latch signal M3 of the current stage.

According to some exemplary embodiments, the tri-state inverter 173 of the feedback path is connected between an output terminal M3 of the data path and an output terminal M2 of the scan path, and feeds back the first latch signal M3 of the previous stage to the output terminal of the scan path according to the input clock signal CK and the modified inverted clock signal CKB.

The slave latch 200 may include a tri-state inverter 215, an inverter 230, and a tri-state inverter 243 according to some exemplary embodiments. Unlike FIG. 3 or FIG. 4, the slave latch 200 may be implemented to include the tri-state inverter 215 without the transfer transistor 220. This tri-state inverter 215 outputs the first latch signal M3 as an input of the second latch signal QI according to the input clock signal CK and the modified inverted clock signal CKB. The inverter 230 inverts the second latch signal QI (QB), and the tri-state inverter 243 may hold the inverted second latch signal QB or output the inverted second latch signal QB to the output driver circuit 300 according to the input clock signal CK and the modified inverted clock signal CKB.

Figure 8:
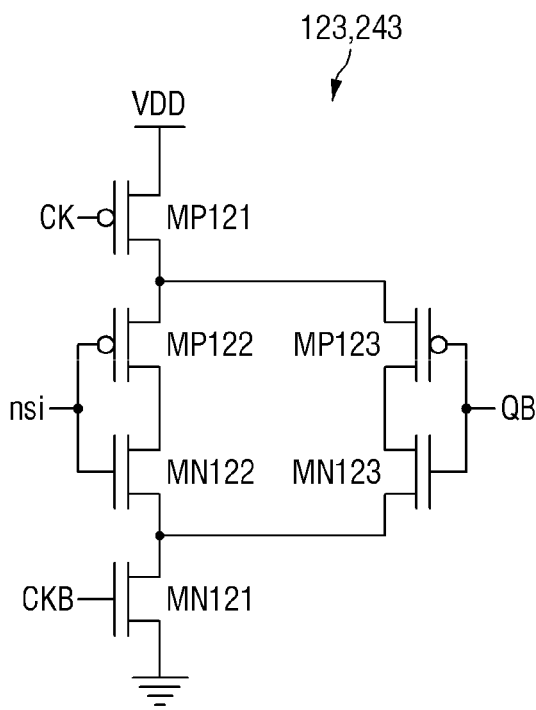
FIGS. 8 to 12 illustrate a portion of the flip-flop circuit of FIG. 7 according to some exemplary embodiments.

Referring to FIG. 8, the tri-state inverter 123 of the scan path and the tri-state inverter 243 disposed in a feedback path of the slave latch may share transistors MP121 and MN121 gated according to the input clock signal CK and the modified inverted clock signal CKB with each other. As an example illustrated in FIG. 8, a PMOS transistor MP121 having a gate terminal to which the input clock signal CK is applied and a source terminal which is connected to a power supply line and an NMOS transistor MN121 having a gate terminal to which the modified inverted clock signal CKB is applied and a source terminal which is connected to a ground line are shared by the tri-state inverter 123 and the tri-state inverter 243 when the tri-state inverter 123 and the tri-state inverter 243 are implemented, such that the number of transistors in a design of the flip-flop circuit may be reduced.

The tri-state inverter 123 may be implemented as an intermediate inverter circuit MP122 and MN122 connected between a drain terminal of the PMOS transistor MP121 and a drain terminal of the NMOS transistor MN121, and may receive the basic scan path signal nsi as an input of an intermediate inverter, invert the basic scan path signal nsi, and output the inverted basic scan path signal nsi.

The tri-state inverter 243 may be implemented as an intermediate inverter circuit MP123 and MN123 connected between the drain terminal of the PMOS transistor MP121 and the drain terminal of the NMOS transistor MN121, and may receive the inverted second latch signal QB as an input of an intermediate inverter, re-invert the inverted second latch signal QB, and output the re-inverted second latch signal QB.

Figure 9:
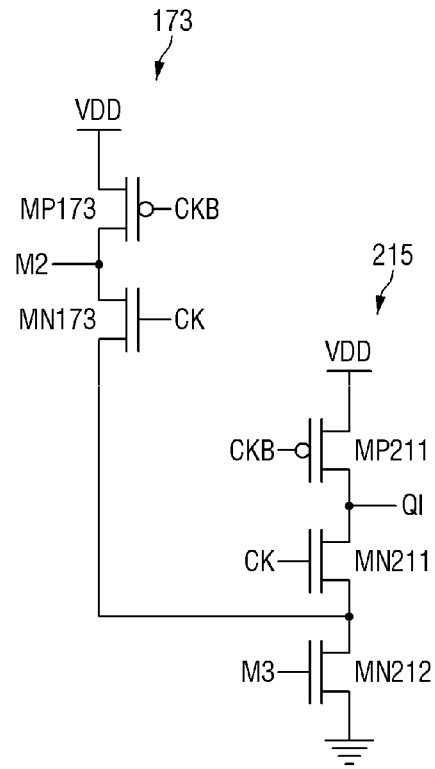
Figure 10:
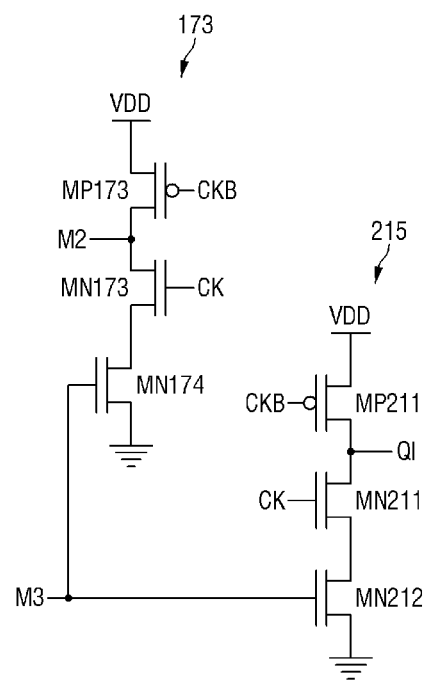

The tri-state inverter 173 included in the feedback path of the master latch 100 and the tri-state inverter 215 included in an input terminal of the slave latch 200 may be implemented as illustrated in FIGS. 9 and 10 according to some exemplary embodiments. Referring to FIG. 9, according to an exemplary embodiment, the tri-state inverter 173 and the tri-state inverter 215 may share an NMOS transistor MN212 having a gate terminal connected to a common node M3 between the output of the master latch 100 and the input of the slave latch 200 with each other.

The tri-state inverter 173 may include a PMOS transistor MP173, an NMOS transistor MN173, and the NMOS transistor MN212, and the tri-state inverter 215 may include a PMOS transistor MP211, an NMOS transistor MN211, and the NMOS transistor MN212. The NMOS transistor MN212 has a source terminal connected to a ground line and the gate terminal connected to the common node M3 between the output of the master latch 100 and the input of the slave latch 200.

The PMOS transistor MP173 and the NMOS transistor MN173 are connected in series between a power supply line VDD and a drain terminal of the NMOS transistor MN212, and have gate terminals to which the modified inverted clock signal CKB and the input clock signal CK are applied, respectively. The tri-state inverter 173 may output the first latch signal M3 to the output terminal M2 of the scan path according to the modified inverted clock signal CKB and the input clock signal CK.

The PMOS transistor MP211 and the NMOS transistor MN211 are connected in series between the power supply line VDD and the drain terminal of the NMOS transistor MN212, and have gate terminals to which the modified inverted clock signal CKB and the input clock signal CK are applied, respectively. The tri-state inverter 215 may output the first latch signal M3 as the second latch signal QI according to the modified inverted clock signal CKB and the input clock signal CK.

Referring to FIG. 10, according to an exemplary embodiment, the tri-state inverter 173 and the tri-state inverter 215 do not share an NMOS transistor having a gate terminal connected to a common node M3 between the output of the master latch 100 and the input of the slave latch 200 with each other, but may be implemented to include separate such separate NMOS transistors, respectively.

The tri-state inverter 173 may include a PMOS transistor MP173, an NMOS transistor MN173, and an NMOS transistor MN174 connected in series between a power supply line VDD and a ground line GND, and the tri-state inverter 215 may include a PMOS transistor MP211, an NMOS transistor MN211, and an NMOS transistor MN212 connected in series between the power supply line VDD and the ground line GND. Unlike FIG. 9, the NMOS transistor MN174 and the NMOS transistor MN212 are implemented, respectively, but gate terminals of the NMOS transistor MN174 and the NMOS transistor MN212 may be connected to the common node M3 between the output of the master latch 100 and the input of the slave latch 200.

Figure 11:
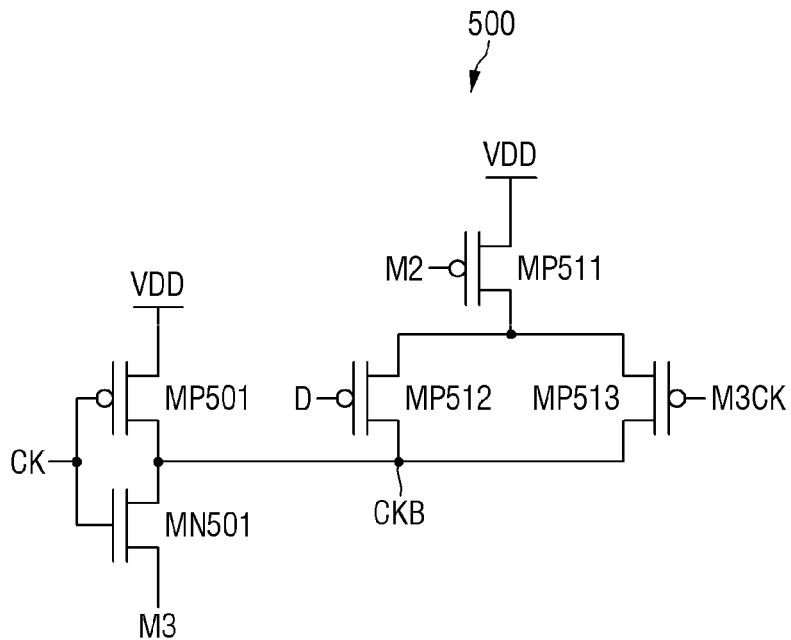
Figure 12:
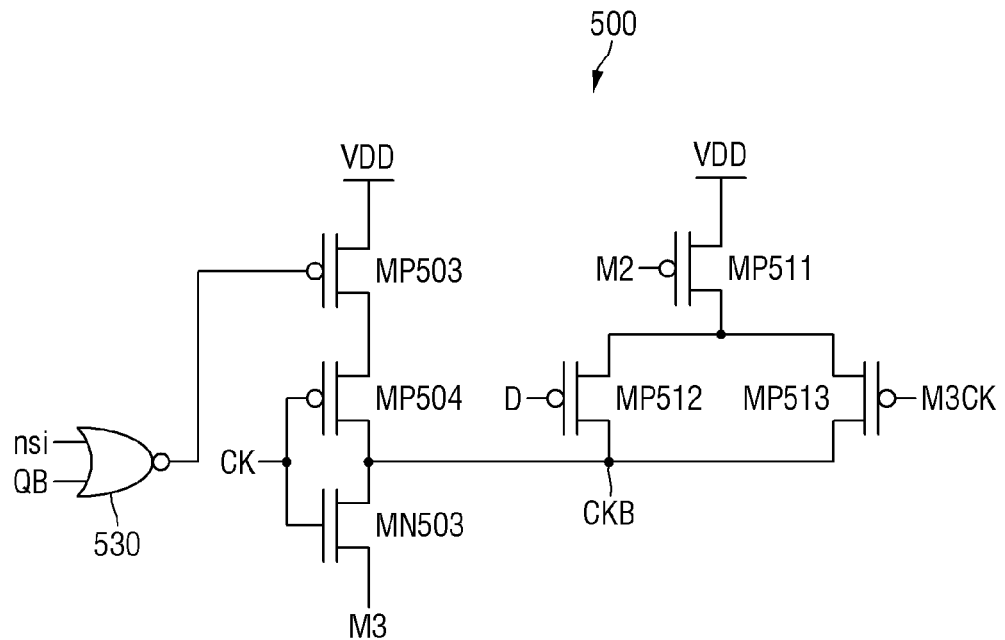

Referring to FIGS. 11 and 12, according to various exemplary embodiments, the clock generator 500 may be implemented as a NAND circuit 520, and may perform a NAND operation on an input clock signal and a modified latch signal M3' to generate a modified inverted clock signal CKB.

In an exemplary embodiment of FIG. 11, the clock generator 500 may include inverters MP501 and MN501 and three PMOS transistors MP511, MP512 and MP513.

The inverters MP501 and MN501 may be connected between the power supply line VDD and the output terminal M3 of the master latch 100, and may receive the input clock signal CK and output the modified inverted clock signal CKB.

An output of the modified inverted clock signal CKB may be controlled by the three PMOS transistors MP511, MP512, and MP513. The PMOS transistor MP511 has a source terminal connected to the power supply line VDD and a gate terminal connected to the output terminal M2 of the scan path. The PMOS transistor MP512 is connected between a drain terminal of the PMOS transistor MP511 and output terminals of the inverters MP501 and MN501, and has a gate terminal to which the data signal D is applied. The PMOS transistor MP513 is connected between the drain terminal of the PMOS transistor MP511 and the output terminals of the inverters MP501 and MN501, and has a gate terminal which is connected to an output terminal of the AOI circuit 143 and 150 and has the modified clock signal M3CK applied thereto.

In an exemplary embodiment of FIG. 12, the clock generator 500 may include a NOR circuit 530, inverters MP504 and MN503, and four PMOS transistors MP503, MP511, MP512 and MP513. The NOR circuit 530 receives the basic scan signal nsi and the inverted second latch signal QB, performs a NOR operation on the basic scan signal nsi and the inverted second latch signal QB, and outputs a signal obtained by such a NOR operation.

The PMOS transistor MP503 has a source terminal connected to the power supply line VDD and a gate terminal connected to an output terminal of the NOR circuit 530. When both the basic scan signal nsi and the inverted second latch signal QB are 0, the PMOS transistor MP503 is turned off, and when at least one of the basic scan signal nsi or the inverted second latch signal QB is 1, the PMOS transistor MP503 is turned on.

The inverters MP504 and MN503 are connected between the drain terminal of the PMOS transistor MP503 and the output terminal M3 of the master latch 100, invert the input clock signal CK, and output the inverted input clock signal CKB, but the inverters MP504 and MN503 may not operate according to the turn-off of the PMOS transistor MP503.

Meanwhile, as shown in FIG. 11, an output of the modified inverted clock signal CKB may be controlled by the three PMOS transistors MP511, MP512, and MP513. The PMOS transistor MP511 has a source terminal connected to the power supply line VDD and a gate terminal connected to the output terminal M2 of the scan path. The PMOS transistor MP512 is connected between a drain terminal of the PMOS transistor MP511 and output terminals of the inverters MP501 and MN501, and has a gate terminal to which the data signal D is applied. The PMOS transistor MP513 is connected between the drain terminal of the PMOS transistor MP511 and the output terminals of the inverters MP501 and MN501, and has a gate terminal which is connected to an output terminal of the AOI circuit 143 and 150 and has the modified clock signal M3CK applied thereto.

Figure 13:
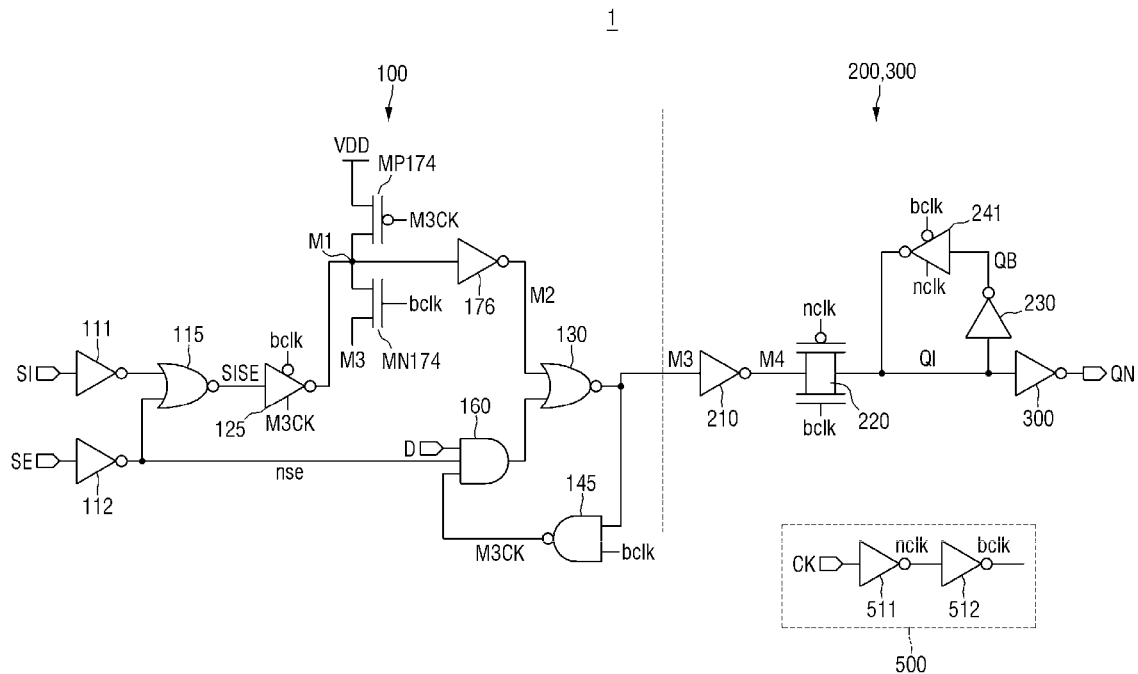
FIG. 13 is a circuit diagram illustrating a flip-flop circuit according to some exemplary embodiments.
Figure 14:
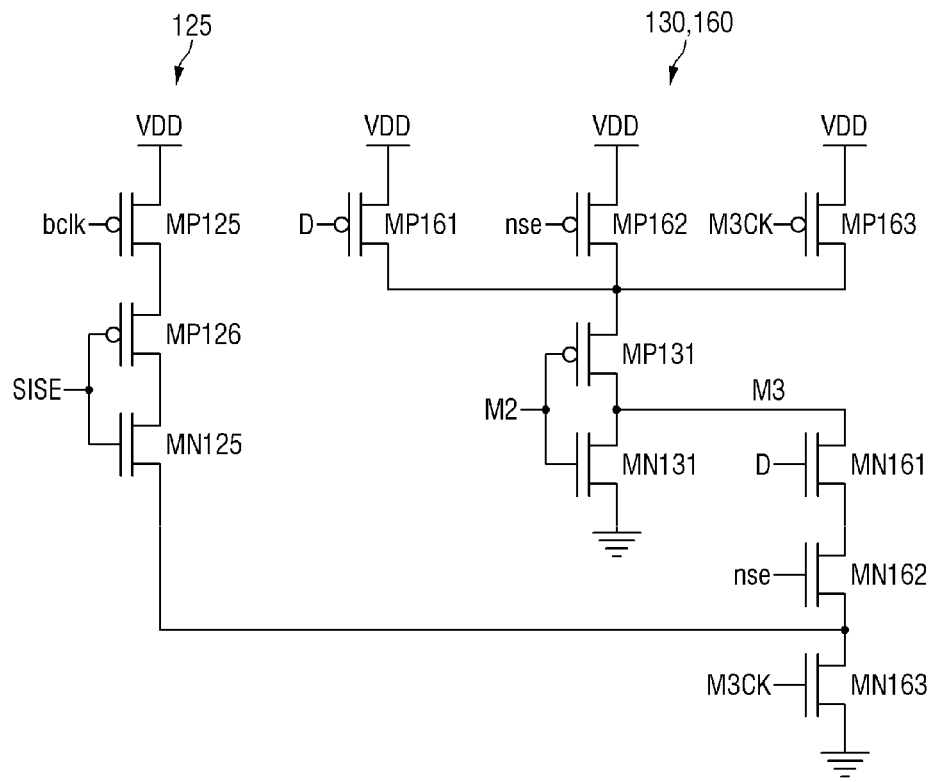
FIGS. 14 to 16 illustrate a portion of the flip-flop circuit of FIG. 13 according to some exemplary embodiments.
Figure 15:
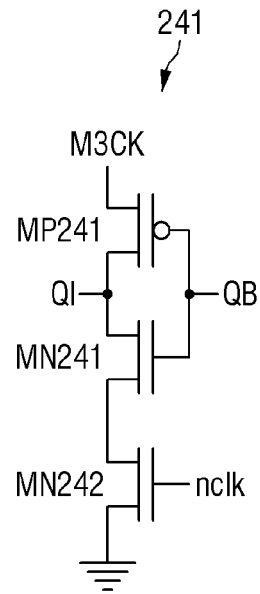
Figure 16:
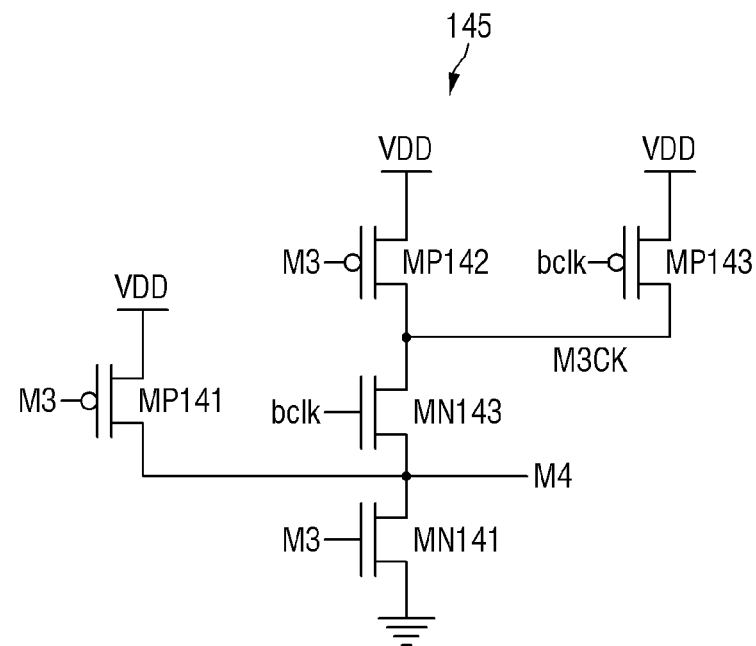

FIG. 13 is a circuit diagram illustrating a flip-flop circuit according to some exemplary embodiments, and FIGS. 14 to 16 illustrate a portion of the flip-flop circuit of FIG. 13 according to some exemplary embodiments. Referring to FIG. 13, a flip-flop circuit 1 includes a master latch 100, a slave latch 200, an output driver circuit 300, and a clock generator 500. The clock generator 500 generates an inverted clock signal nclk inverted from an input clock signal and a buffered clock signal bclk inverted from the inverted clock signal.

The master latch 100 includes a scan path and a data path electrically connected to an output terminal of the master latch independently of each other without a feedback path, unlike exemplary embodiments of FIGS. 2 to 12. An operation on an inverted scan enable signal nse and an inverted scan input signal nsi (output from the inverter 111) is performed in the scan path and outputs a scan path signal M2 according to an output signal of the clock generator 500. The data path outputs a signal obtained by performing an operation on the inverted scan enable signal nse, the output signal of the clock generator, and a data signal D as a first latch signal M3 according to the scan path signal M2.

According to some exemplary embodiments, the data path may include a NAND circuit 145 and an AOI circuit 160 and 130. The NAND circuit 145 receives the buffered clock signal bclk and the first latch signal M3 and outputs an modified clock signal M3CK. The AOI circuit 160 and 130 receives the inverted scan enable signal nse, the modified clock signal M3CK, and the data signal D, performs an AND operation on the inverted scan enable signal nse, the modified clock signal M3CK, and the data signal D, performs a NOR operation on the scan path signal M2 and a signal obtained by such an AND operation, and outputs a signal obtained by such a NOR operation as the first latch signal M3.

According to some exemplary embodiments, the scan path may include a NOR circuit 115, a tri-state inverter 125, a PMOS transistor MP174, an NMOS transistor 174, and an inverter 176. The NOR circuit 115 performs a NOR operation on the inverted scan input signal nsi and the inverted scan enable signal nse and outputs a basic scan signal SISE. The tri-state inverter 125 may invert the basic scan signal SISE according to the inverted clock signal nclk and the buffered clock signal bclk and output the inverted basic scan signal to a first node M1.

The PMOS transistor MP174 has a source terminal which is connected to a power supply line, a drain terminal which is connected to the first node M1, and a gate terminal to which the modified clock signal M3CK is applied. The NMOS transistor MN174 has a source terminal which is connected to an output terminal M3 of the master latch, a drain terminal which is connected to the first node M1, and a gate terminal to which the buffered clock signal bclk is applied. The inverter 176 may invert the signal input to the first node M1 and output the inverted signal as the scan path signal M2.

According to some exemplary embodiments, the scan path may further include two scan inverters. The scan inverter 112 may invert a scan enable signal to generate the inverted scan enable signal nse, and the scan inverter 111 may invert a scan input signal to generate the inverted scan input signal nsi.

Referring to FIG. 14, according to some exemplary embodiments, the tri-state inverter 125 and the AOI circuit 160 and 130 may share an NMOS transistor MN163 with each other. For example, the tri-state inverter 125 may include a PMOS transistor MP125, a first intermediate inverter MP126 and MN125, and the NMOS transistor MP163 sequentially connected in series between the power supply line VDD and the ground line GND.

The PMOS transistor MP125 may be gated by the buffered clock signal bclk, and the first intermediate inverter MP126 and MN125 may invert the basic scan signal SISE and output the inverted basic scan signal to the first node M1. Specifically, a PMOS transistor MP126 and an NMOS transistor MN125 may receive the basic scan signal SISE through their respective gates, and output the basic scan signal inverted based on the clock signals bclk and M3CK to a common node between the PMOS transistor MP126 and the NMOS transistor MN125 (node at which drain terminals of the PMOS transistor MP126 and the NMOS transistor MN125 are directly connected to each other).

The AOI circuit 160 and 130 may include a second intermediate inverter MP131 and MN131, three PMOS transistors MP161, MP162, and MP163, and three NMOS transistors MN161, MN162, and MN163. The AOI circuit 160 and 130 performs an AND operation on three signals D, nse, and M3CK, which are inputs, performs an OR-Invert operation on a signal obtained such an AND operation and the scan path signal M2, and outputs a signal obtained by such an OR-Invert operation as the first latch signal M3. Specifically, the second intermediate inverter MP131 and MN131 is connected between a third node (the third node is common drain terminals of MP161, MP162, MP163) and the ground line, and have input terminals connected to the output terminal M2 of the scan path and output terminals connected to the output terminal M3 of the master latch. The third node refers to a source terminal of the PMOS transistor MP131.

The PMOS transistor MP161, the PMOS transistor MP162, and the PMOS transistor MP163 are connected in parallel between the power supply line VDD and the third node. The PMOS transistors MP161, MP162, and MP163 have gate terminals to which the data signal D, the inverted scan enable signal nse, and the modified clock signal M3CK are applied, respectively.

The NMOS transistor MN161, the NMOS transistor MN162, and the NMOS transistor MN163 are connected in series between the ground line GND and the third node. The NMOS transistors MN161, MN162, and MN163 have gate terminals to which the data signal D, the inverted scan enable signal nse, and the modified clock signal M3CK are applied, respectively. The slave latch 200 may be variously implemented according to exemplary embodiments. As an exemplary embodiment, referring to FIG. 13, the slave latch 200 may be implemented in the same manner as the slave latch of FIG. 3.

Referring to FIGS. 13 and 15, a feedback path of the slave latch may include a tri-state inverter 241, and the tri-state inverter 241 may be implemented with inverters MP241 and MN241 and an NMOS transistor MN242. Specifically, the tri-state inverter 241 may include the inverters MP241 and MN241 and the NMOS transistor MN242 connected in series between an output node of the NAND circuit 145 and the ground line GND. The NMOS transistor MN242 may be gated by the inverted clock signal nclk, and the inverters MP241 and MN241 may receive an inverted second latch signal QB and output a re-inverted second latch signal QI according to an operation of the NMOS transistor MN242.

Referring to FIG. 16, according to some exemplary embodiments, the NAND circuit 145 of the data path and the inverter 210 (FIG. 13) of the slave latch may share an NMOS transistor MN141 with each other. Accordingly, the number of transistors to be implemented is reduced by sharing some of transistors, and a more efficient layout may thus be implemented in terms of an area of the master latch 100.

For example, the NAND circuit 145 may include two PMOS transistors MP142 and MP143 and two NMOS transistors MN141 and MN143 that receive the first latch signal M3 and the buffered clock signal bclk as inputs and output the modified clock signal M3CK obtained by an NAND operation. In this case, the inverter 210 may include a PMOS transistor MP141 and the NMOS transistor MN141 that receive the first latch signal M3 through their gates and use a common node between the NMOS transistor MN141 and the NMOS transistor MN 143 as an output node.

Figure 17:
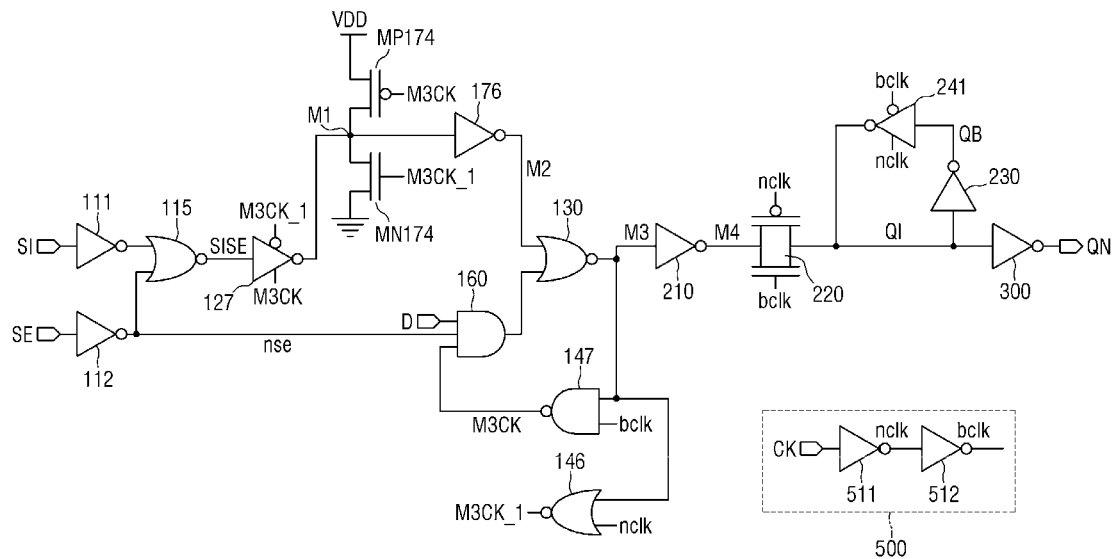
FIG. 17 is a circuit diagram illustrating a flip-flop circuit according to some exemplary embodiments.

FIG. 17 is a circuit diagram illustrating a flip-flop circuit according to some exemplary embodiments. For convenience of explanation, a description overlapping that of FIG. 13 will be omitted. A master latch of FIG. 17 includes a scan path and a data path and may not include a feedback path, like the master latch of FIG. 13. However, the master latch of FIG. 17 may operate using an inverted modified clock signal M3CK_1 and an modified clock signal M3CK instead of the inverted clock signal nclk and the buffered clock signal bclk output from the clock generator 500 as clock signals, unlike the master latch of FIG. 13.

The master latch 100 may further include a NOR circuit 146 performing a NOR operation on the inverted clock signal nclk and the first latch signal M3 of the previous stage to generate the inverted modified clock signal M3CK_1. In addition, the NAND circuit 147 may perform a NAND operation on the buffered clock signal bclk and the first latch signal M3 of the previous stage to generate the modified clock signal M3CK.

When the tri-state inverter 127 of the scan path inverts the basic scan signal SISE and outputs the inverted basic scan signal to the first node M1, the tri-state inverter 127 may output the inverted basic scan signal based on the inverted modified clock signal M3CK_1 and the modified clock signal M3CK. In addition, the PMOS transistor MP174 may be gated by the modified clock signal M3CK, and the NMOS transistor MN174 may be gated by the inverted modified clock signal M3CK_1.

Figure 18:
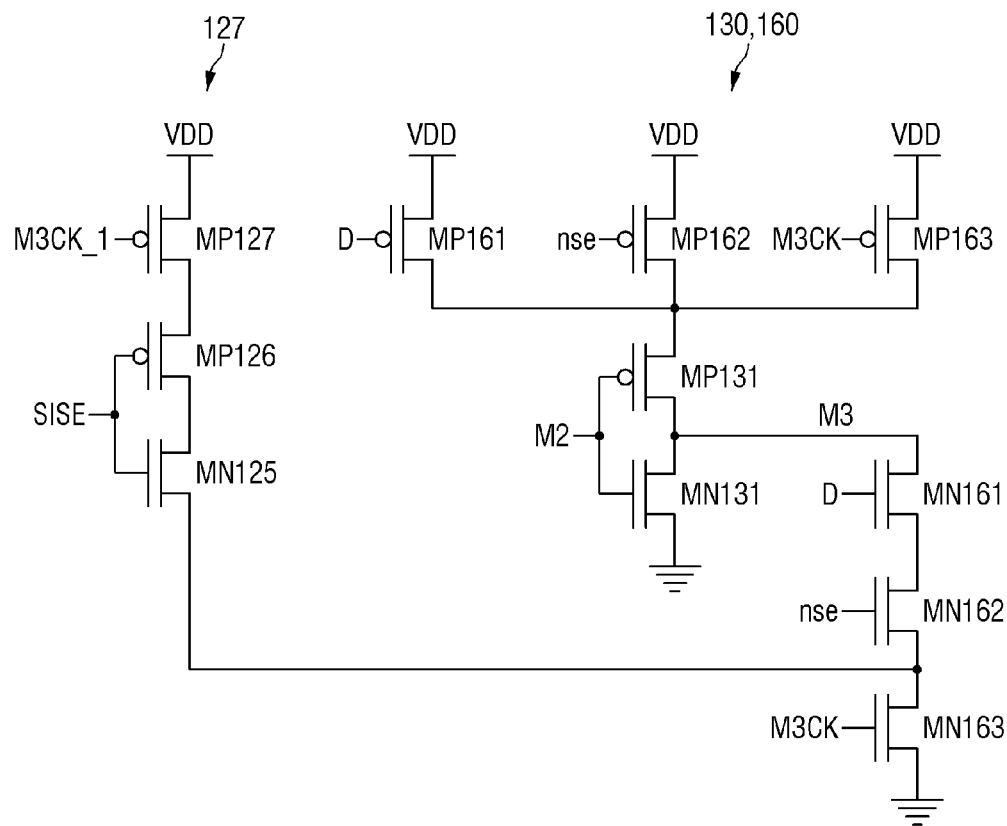
FIGS. 18 and 19 illustrate a portion of the flip-flop circuit of FIG. 17 according to some exemplary embodiments.
Figure 19:
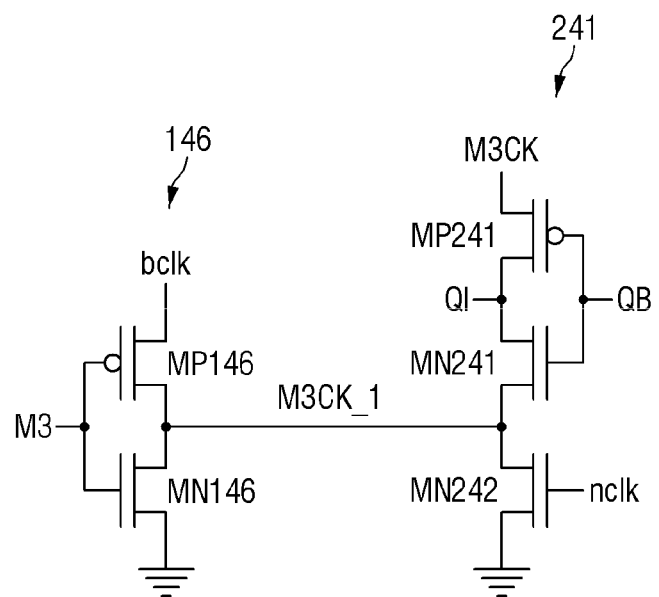

FIGS. 18 and 19 illustrate a portion of the flip-flop circuit of FIG. 17 according to some exemplary embodiments. Referring to FIG. 18, unlike FIG. 14, the PMOS transistor MP127 may be gated by the inverted modified clock signal M3CK_1 rather than the buffered clock signal bclk. As illustrated in FIG. 19, according to some exemplary embodiments, the tri-state inverter 241 of the slave latch and the NOR circuit 146 of the master latch may be implemented with two inverters and an NMOS transistor MN242. Specifically, the inverters MP241 and MN241 and the NMOS transistor MN242 are implemented in the same structure as that of FIG. 15. However, the NOR circuit may be implemented with inverters MP146 and MN146 and the NMOS transistor MN242 to output the first latch signal M3 input to the inverters MP146 and MN146 as the inverted modified clock signal M3CK_1 according to the inverted clock signal nclk. In this case, the inverters MP146 and MN146 may be connected between a node to which the buffered clock signal bclk is output and the ground terminal GND.

The NOR circuit should be generally implemented with four transistors, but when the NOR circuit is implemented as illustrated in FIG. 19, there is an advantage that the NOR circuit may be implemented with a smaller number of transistors.

The exemplary embodiments of the present disclosure have been described hereinabove with reference to the accompanying drawings, but it will be understood by one of ordinary skill in the art to which the present disclosure pertains that various modifications and alterations may be made without departing from the technical spirit or essential feature of the present disclosure. Therefore, it is to be understood that the exemplary embodiments described above are illustrative rather than being restrictive in all aspects.

What is claimed is:

1. A flip-flop circuit, comprising:
 a clock generator configured to generate a plurality of clock signals; and
 a master-slave latch circuit including a master latch and a slave latch, said master latch comprising:
  a scan path configured to output a scan path signal in response to a scan enable signal and a scan input signal;
  a data path configured to output a first latch signal in response to performing an operation on a data signal and the scan path signal, which is a function of the plurality of clock signals; and
  a feedback path comprising a first tri-state inverter, which is connected between an output terminal of the data path and an output terminal of the scan path, said feedback path configured to feed back the first latch signal of a previous state according to the plurality of clock signals;
 wherein the data signal is input to the data path independently of the scan path.

2. The flip-flop circuit of claim 1, wherein the clock generator is configured to generated the plurality of clock signals by generating an inverted clock signal from an input clock signal, and a buffered clock signal, which is an inverted version of the inverted clock signal.

3. The flip-flop circuit of claim 2, wherein the data path includes:
 a first AND-OR-Inverter (AOI) circuit configured to generate a modified clock signal in response to the buffered clock signal, the first latch signal, and the scan enable signal; and a second AOI circuit configured to generate the first latch signal in response to the modified clock signal and the data signal.

4. The flip-flop circuit of claim 2, wherein the scan path includes:
a NAND circuit configured to generate a basic scan signal, in response to receiving the scan enable signal and the scan input signal; and
a second tri-state inverter circuit configured to generate the scan path signal in response to the basic scan signal received at an input thereof, and a pair of control signals including the inverted clock signal and the buffered clock signal.

5. The flip-flop circuit of claim 1, wherein the slave latch includes:
a transfer transistor configured to receive a true or complementary version of the first latch signal at an input thereof, and transfer the version of the first latch signal to an output thereof in response to the plurality of clock signals;
a slave inverter having an input terminal electrically coupled to the output of said transfer transistor, said slave inverter configured to generate an inverted first latch signal; and
a third tri-state inverter configured to feed back the inverted first latch signal to the input terminal of the slave inverter based on the plurality of clock signals.

6. The flip-flop circuit of claim 5, wherein the slave latch further includes a second inverter having an input terminal connected to an output terminal of the master latch and an output terminal connected to the input terminal of the transfer transistor.

7. The flip-flop circuit of claim 6, further comprising:
a totem pole arrangement of first and second P-channel metal oxide semiconductor (PMOS) transistors and first and second N-channel metal oxide semiconductor (NMOS) transistors, which are connected in series between a power supply line and a ground reference line;
wherein gate terminals of the first PMOS transistor and the second NMOS transistor are connected to the output terminal of the data path;
wherein the plurality of clock signals are applied to gate terminals of the second PMOS transistor and the first NMOS transistor, respectively; and
wherein a common node between the first NMOS transistor and the second NMOS transistor is connected to the input terminal of the transfer transistor.

8. A flip-flop circuit, comprising:
a clock generator configured to generate first and second clock signals having different phases relative to each other; and
a master-slave latch circuit including a master latch and a slave latch, said master latch comprising:
a scan path configured to output a scan path signal in response to a scan enable signal and a scan input signal;
a data path configured to output a first latch signal in response to a data signal and the scan path signal; and
a feedback path comprising a first tri-state inverter responsive to the first and second clock signals, said first tri-state inverter having an input terminal connected to an output terminal of the data path and an output terminal connected to a node of the scan path.

9. The flip-flop circuit of claim 8, wherein the scan path comprises a second tri-state inverter responsive to the plurality of clock signals; and wherein the node of the scan path corresponds to an output terminal of the second tri-state inverter.

10. The flip-flop circuit of claim 8, wherein the scan path comprises a logic gate having first and second input terminals responsive to the scan enable signal and the scan input signal, respectively, and a second tri-state inverter having an input terminal electrically coupled to an output terminal of the logic gate and an output terminal electrically connected to the node of the scan path; wherein true and complementary control terminals of the second tri-state inverter are responsive to the first and second clock signals, respectively; and wherein true and complementary control terminals of the first tri-state inverter are responsive to the second and first clock signals, respectively.

11. A flip-flop circuit comprising:
a clock generator generating an inverted clock signal inverted from an input clock signal and a buffered clock signal inverted from the inverted clock signal;
a master latch; and
a slave latch,
wherein the master latch includes:
a scan path performing an operation on an inverted scan enable signal and an inverted scan input signal and outputting a scan path signal according to an output signal of the clock generator; and
a data path outputting a signal obtained by performing an operation on the inverted scan enable signal, the output signal of the clock generator, and a data signal as a first latch signal according to the scan path signal, and
the data signal is input to the data path independently of the scan path.

12. The flip-flop circuit of claim 11, wherein the data path includes:
a NAND circuit receiving the buffered clock signal and the first latch signal and outputting an modified clock signal; and
an AOI circuit receiving the inverted scan enable signal, the modified clock signal, and the data signal, performing an AND operation on the inverted scan enable signal, the modified clock signal, and the data signal, performing a NOR operation on the scan path signal and a signal obtained by the AND operation, and outputting a signal obtained by the NOR operation as the first latch signal.

13. The flip-flop circuit of claim 11, wherein the scan path includes:
a NOR circuit performing a NOR operation on the inverted scan input signal and the inverted scan enable signal and outputting a basic scan signal;
a first tri-state inverter inverting the basic scan signal according to the inverted clock signal and the buffered clock signal and outputting the inverted basic scan signal to a first node;
a first PMOS transistor having a source terminal which is connected to a power supply line, a drain terminal which is connected to the first node, and a gate terminal to which an modified clock signal is applied;
a first NMOS transistor having a source terminal which is connected to an output terminal of the master latch, a drain terminal which is connected to the first node, and a gate terminal to which the buffered clock signal is applied; and
a first inverter inverting the signal input to the first node and outputting the inverted signal as the scan path signal.

14. The flip-flop circuit of claim 13, wherein the scan path further includes:
a first scan inverter inverting a scan enable signal to generate the inverted scan enable signal; and
a second scan inverter inverting a scan input signal to generate the inverted scan input signal.

15. The flip-flop circuit of claim 13, wherein the first tri-state inverter and the AOI circuit share a second NMOS transistor with each other, the second NMOS transistor having a source terminal which is connected to a ground line and a gate terminal to which the modified clock signal is applied.

16. The flip-flop circuit of claim 15, wherein the first tri-state inverter includes a first-first PMOS transistor, a first intermediate inverter, and the second NMOS transistor which are connected in series between the power supply line and the ground line,
the first-first PMOS transistor is gated by the buffered clock signal, and
the first intermediate inverter inverts the basic scan signal and outputs the inverted basic scan signal to the first node.

17. The flip-flop circuit of claim 11, wherein the slave latch includes:
an input inverter inverting the first latch signal;
a transfer transistor transferring the inverted first latch signal according to the output signal of the clock generator;
a slave inverter receiving the inverted first latch signal, re-inverting the inverted first latch signal, and outputting the re-inverted first latch signal; and
a third tri-state inverter feeding back the re-inverted first latch signal to an input of the input inverter based on the output signal of the clock generator.

18. The flip-flop circuit of claim 17, wherein the NAND circuit includes:
an intermediate inverter connected in series between an output node of the input inverter and a power supply line and receiving the buffered clock signal; and
a second-first PMOS transistor connected between the output node of the input inverter and the power supply line and gated by the first latch signal, and
the modified clock signal is output to an output node of the intermediate inverter.

19. The flip-flop circuit of claim 13, wherein the data path further includes a NOR circuit performing a NOR operation on the inverted clock signal and the first latch signal of the previous stage to generate an inverted modified clock signal.

20. The flip-flop circuit of claim 19, wherein the master latch operates based on the modified clock signal and the inverted modified clock signal.

* * * * *